United States Patent
Saraliev

(10) Patent No.: US 7,551,979 B2
(45) Date of Patent: Jun. 23, 2009

(54) ROBOT CALIBRATION SYSTEM AND METHOD

(75) Inventor: Daniel P. Saraliev, San Luis Obispo, CA (US)

(73) Assignee: Strasbaugh, San Luis Obispo, CA (US)

(*) Notice: Subject to any disclaimer, the term of this patent is extended or adjusted under 35 U.S.C. 154(b) by 196 days.

(21) Appl. No.: 11/600,978

(22) Filed: Nov. 17, 2006

(65) Prior Publication Data
US 2007/0150100 A1 Jun. 28, 2007

Related U.S. Application Data

(60) Provisional application No. 60/738,243, filed on Nov. 18, 2005.

(51) Int. Cl.
*G06F 19/00* (2006.01)

(52) U.S. Cl. ........................ 700/245; 700/218; 700/255; 700/258; 700/259; 414/754; 414/757; 414/777; 414/783; 414/816; 318/568.16; 318/640; 901/16; 901/47; 73/856; 73/866.5; 198/394

(58) Field of Classification Search ................. 700/218, 700/245, 255, 258, 259; 414/754, 757, 777, 414/783, 816, 936, 941; 318/568.16, 640; 901/6, 16, 47; 73/866, 5; 198/394
See application file for complete search history.

(56) References Cited

U.S. PATENT DOCUMENTS

| 5,535,306 | A | | 7/1996 | Stevens |
| 6,051,286 | A | * | 4/2000 | Zhao et al. .................. 427/576 |
| 6,123,766 | A | * | 9/2000 | Williams et al. .............. 117/85 |
| 6,189,482 | B1 | * | 2/2001 | Zhao et al. ............. 118/723 R |
| 6,549,277 | B1 | * | 4/2003 | Narushima et al. .......... 356/218 |
| 6,822,413 | B2 | * | 11/2004 | Simondet ............... 318/568.21 |
| 6,856,863 | B1 | | 2/2005 | Sundar |
| 6,934,606 | B1 | | 8/2005 | Genetti et al. |
| 2005/0102064 | A1 | | 5/2005 | Donoso et al. |

OTHER PUBLICATIONS

International Search Report dated May 20, 2008 for PCT/US07/84882.
Written Opinion dated May 20, 2008 for PCT/US07/84882.

* cited by examiner

*Primary Examiner*—Khoi H. Tran
*Assistant Examiner*—Marc McDieunel
(74) *Attorney, Agent, or Firm*—Susan L. Crockett, Esq.; Crockett & Crockett

(57) ABSTRACT

A robot calibration system and method for robots in semiconductor wafer processing systems is disclosed. The calibration system comprises a calibration array, a dummy wafer and a control system programmed with a calibration routine. The calibration array has an plurality of inductive proximity sensors to determine parallelism of the robot relative to a station and a center locating sensor to determine the center of the station.

13 Claims, 13 Drawing Sheets

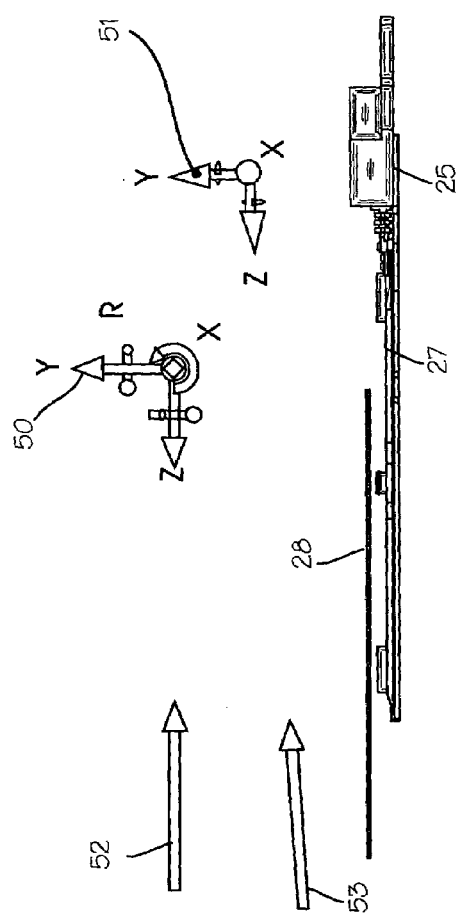
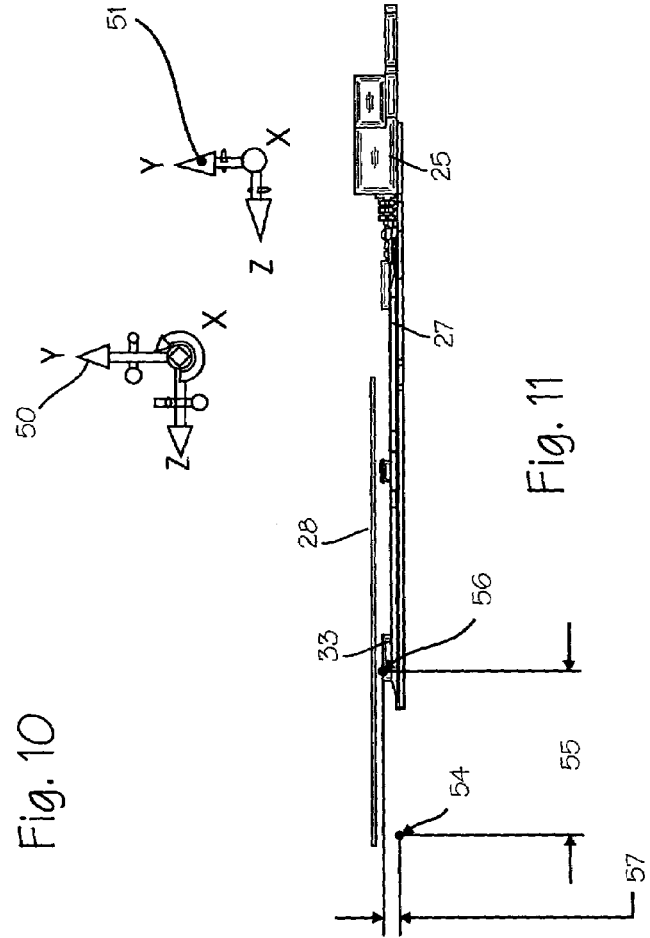
Fig. 10
Fig. 11

ROBOT CALIBRATION SYSTEM AND METHOD

This application claims priority to U.S. provisional application 60/738,243, filed Nov. 18, 2005.

FIELD OF THE INVENTIONS

The inventions described below relate the field of robotic position calibration, and more specifically, to calibration of a 6-axis robot for semiconductor wafer processing tools.

BACKGROUND OF THE INVENTIONS

Robotic position calibration is a problem in automation systems using robots. The most common calibration of the desired positions for robots is done manually. For 3-axis or polar robots, calibration can be achieved using the motion pendants provided by the robot manufacturer. In wafer processing, 3-axis robots can locate the height of a wafer and find the correct x-and y coordinates of the center. For 6-axis robots, the additional degrees of freedom create desired flexibility to adjust the end effectors for three angular positions. However, greater flexibility requires greater complexity of calibration since angular positions must be calibrated for each of the stations in addition to the height and center location. Robots typically use end effectors, which are devices or tools connected to the end of a robot arm. In wafer processing systems, such as CMP, stations are locations systems where wafer's are picked up or placed.

Robots are calibrated to safely move delicate silicon wafers to and from several positions or stations within the CMP tool and to and from cassettes or pods where groups of wafers are input or taken from the tool. While locations of the robot and stations are roughly known within a general area, the exact location and orientation varies between each end effectors due to the accumulation of manufacturing tolerances. Distortions during end effectors shipping or robot "crashes" into CMP tool frames also dislocate the original orientation. Thus, precision robot station calibration is required for reliable and safe handling of expensive semiconductor wafers.

Manual calibration by an expert can take days and has many drawbacks. Manual calibration is dependent upon the vision and visual access of the skilled expert. Furthermore, manual calibration is time-consuming, costly and inconsistent. Sometimes tool geometry makes safe observation of robot motions difficult or impossible.

SUMMARY

The system and method for robot calibration disclosed below uses a calibration array comprising inductive sensors. The actual end effectors used by the robot in a production process holds the calibration array. The array is placed in proximity to a dummy wafer disposed within a work station. A control computer performs a calibration routine using the dummy wafer and the calibration array. The system and method facilitate the teaching of wafer handling end-effectors and allow the timely and efficient calibration of robots by non-specialist technicians.

BRIEF DESCRIPTION OF THE DRAWINGS

FIG. 10 shows the consequence of the physical and robot tool coordinate system having their $\theta_x$ orientations misaligned.

FIG. 11 illustrates $\theta_x$ tool rotation calibration procedure.

DETAILED DESCRIPTION OF THE INVENTIONS

Figure 1:
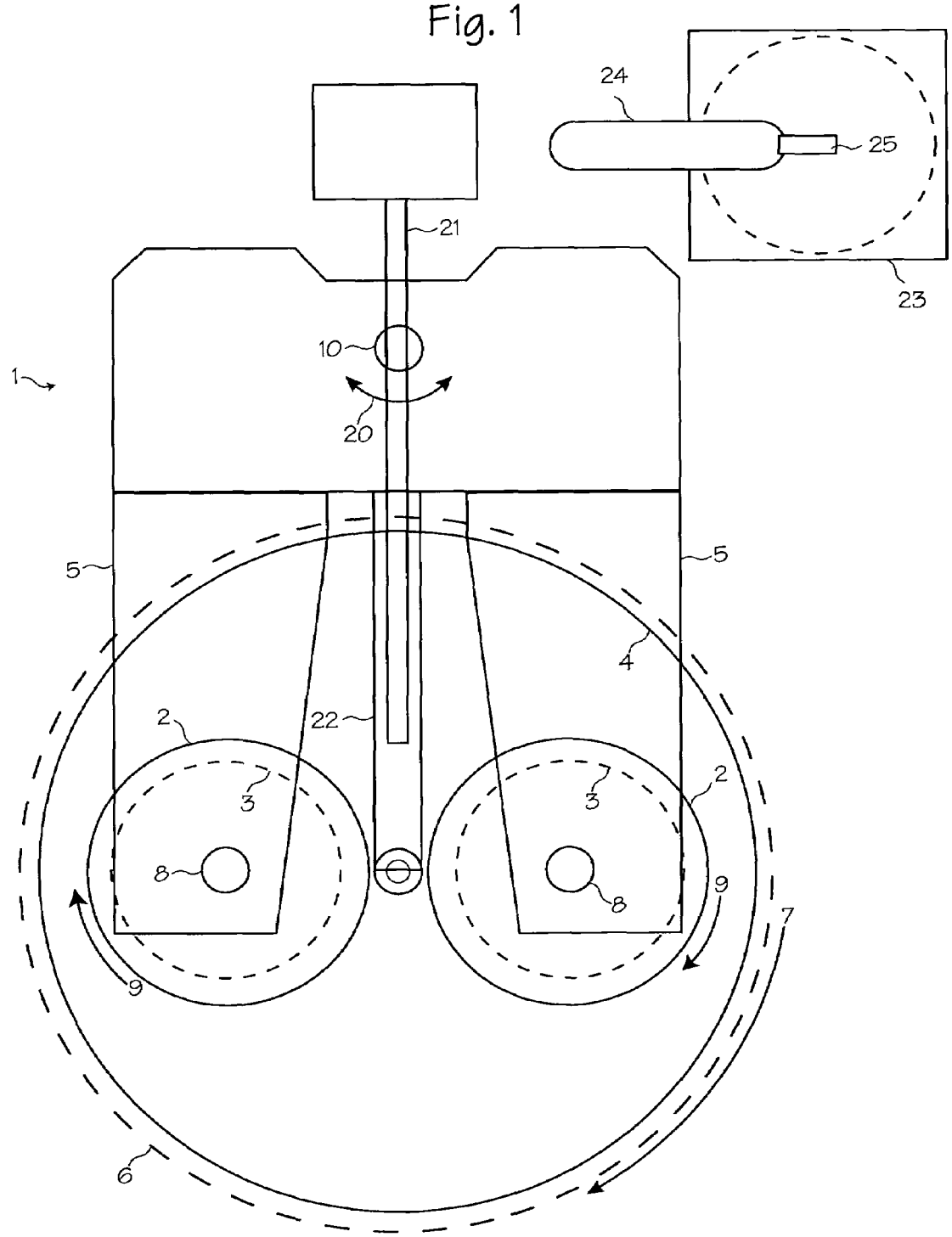
FIG. 1 shows a system for performing chemical mechanical planarization (CMP).

FIG. 1 shows a system 1 for performing chemical mechanical planarization (CMP). One or more polishing heads or wafer carriers 2 hold wafers 3 (shown in phantom to indicate their position underneath the wafer carrier) suspended over a polishing pad 4. A wafer carrier 2 thus has a means for securing and holding a wafer 3. The wafer carriers 2 are suspended from translation arms 5. The polishing pad is disposed on a platen 6, which spins in the direction of arrows 7. The wafer carriers 2 rotate about their respective spindles 8 in the direction of arrows 9. The wafer carriers 2 are also translated back and forth over the surface of the polishing pad by the translating spindle 10, which moves as indicated by arrows 20. The slurry used in the polishing process is delivered onto the surface of the polishing pad through slurry injection tube 21, which is disposed on or through a suspension arm 22. Other chemical mechanical planarization systems may use only one wafer carrier 2 that holds one wafer 3, or may use several wafer carriers 2 that hold several wafers 3. Other systems may also use separate translation arms to hold each carrier. CMP systems typically have one or more stations 23 where wafers are loaded and unloaded by one or more robots 24 having one or more end effectors 25 adapted to handle wafers.

Figure 2:
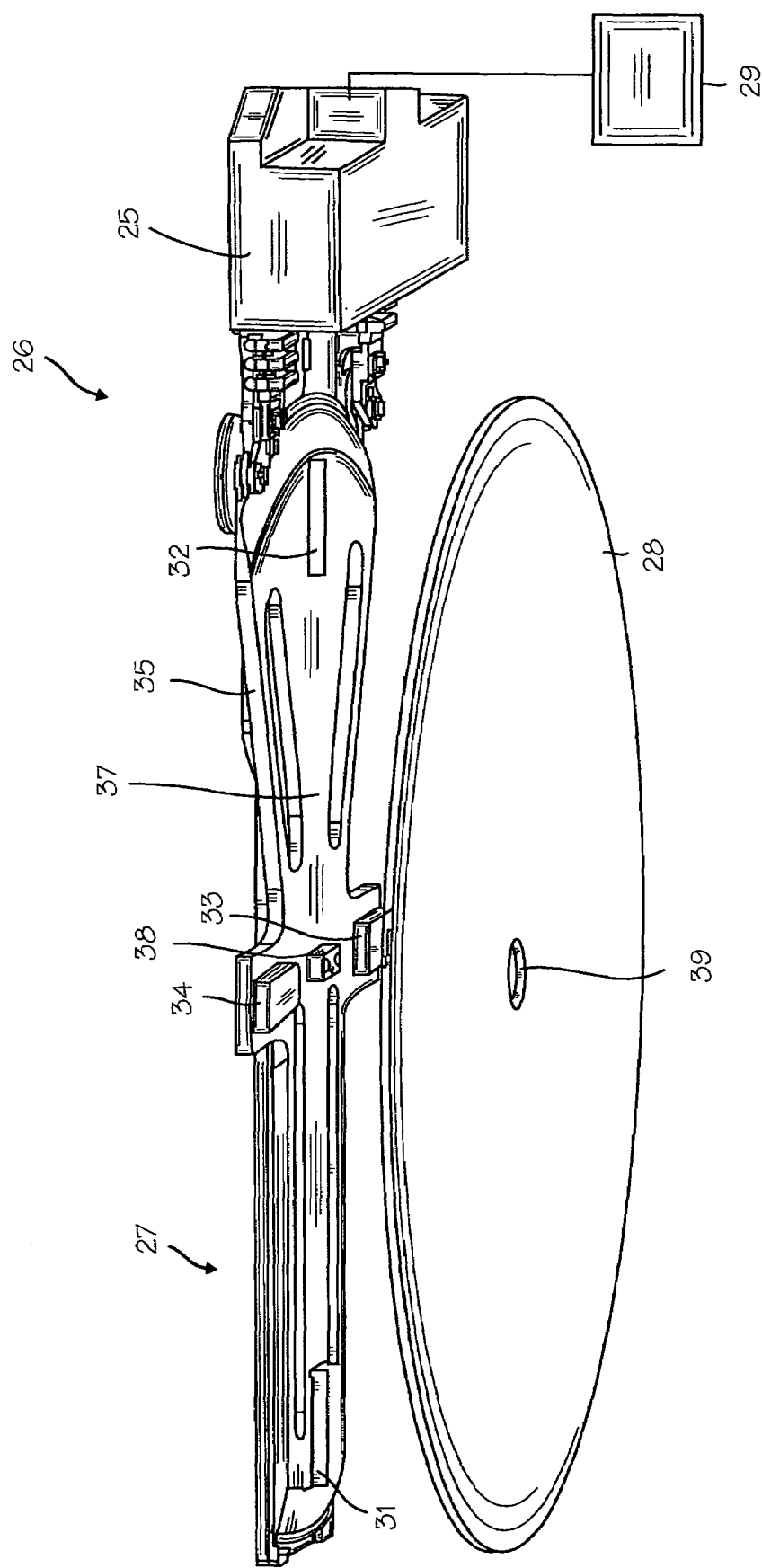
FIG. 2 illustrates a robot calibration system.

FIG. 2 illustrates a robot calibration system 26 comprising a calibration array 27, a dummy wafer 28 and a control system 29 programmed with a calibration routine and operable coupled to the robot end effectors 25. The calibration array can be placed in electrical communication with the control system wirelessly through standard wireless protocols or by hard wire. The calibration array comprises an array of inductive proximity sensors 31, 32, 33 and 34 disposed within a sensor mount 35 and used to determine parallelism of the robot and its end effectors relative to a station. The proximity sensors sense distance and may be used to determine planarity between the dummy wafer and the calibration array. In FIG. 2, the sensor mount is substantially planar with actuate edges. The sensor mount has a rectangular first section 36 that transitions into a wider V-shaped second section 37. The calibration array further comprises a center-locating sensor 38 using a fiber optic sensor to determine the center of the station. The calibration array is held by the end effectors that is used during the manufacturing process. The end effectors in FIG. 2 is used to hold and transport wafers in the CMP system.

In FIG. 2, the dummy wafer mimics a silicon wafer and is used to illustrate how a typical wafer sits in the various stations of the CMP system. The wafer can be round or square depending on the system. In FIG. 2, the dummy wafer is sized and dimensioned to reflect a 350 mm semiconductor wafer. The dummy wafer 28 may be manufactured from stainless steel. Here, the dummy wafer 28 is a round disk approximately 350 mm in diameter and contains an aperture or void 39 disposed in its approximate center. The dummy wafer sits in each station being calibrated. The dummy wafer 28 is designed to mimic how a real wafer sits in the various stations. When the calibration procedure is performed, the end effectors is positioned relative to the dummy wafer's location. As the stations vary slightly from machine to machine, the calibration procedure obtains the locations necessary for the robot to pick and place wafers.

Using a calibration array during calibration procedures held by the same end effectors used to transport objects during production has advantages over traditional calibration systems using specialized calibration end effectors. In traditional calibration systems, offsets need to be programmed into control systems for robots to compensate for the differences in geometry between the end effectors used during calibration and the end effectors used during production. Tolerances in the construction of end effectors cause slight variations in geometries, so for each end effectors, a specific offset would need to be measured to ensure accurate calibration. The need for and amount of offsets are reduced when using the calibration array with the production end effectors. Furthermore, the same dummy wafer and calibration array can be used on multiple tools and multiple end effectors handing the same type of objects in a manufacturing or assembly system.

Figure 3:
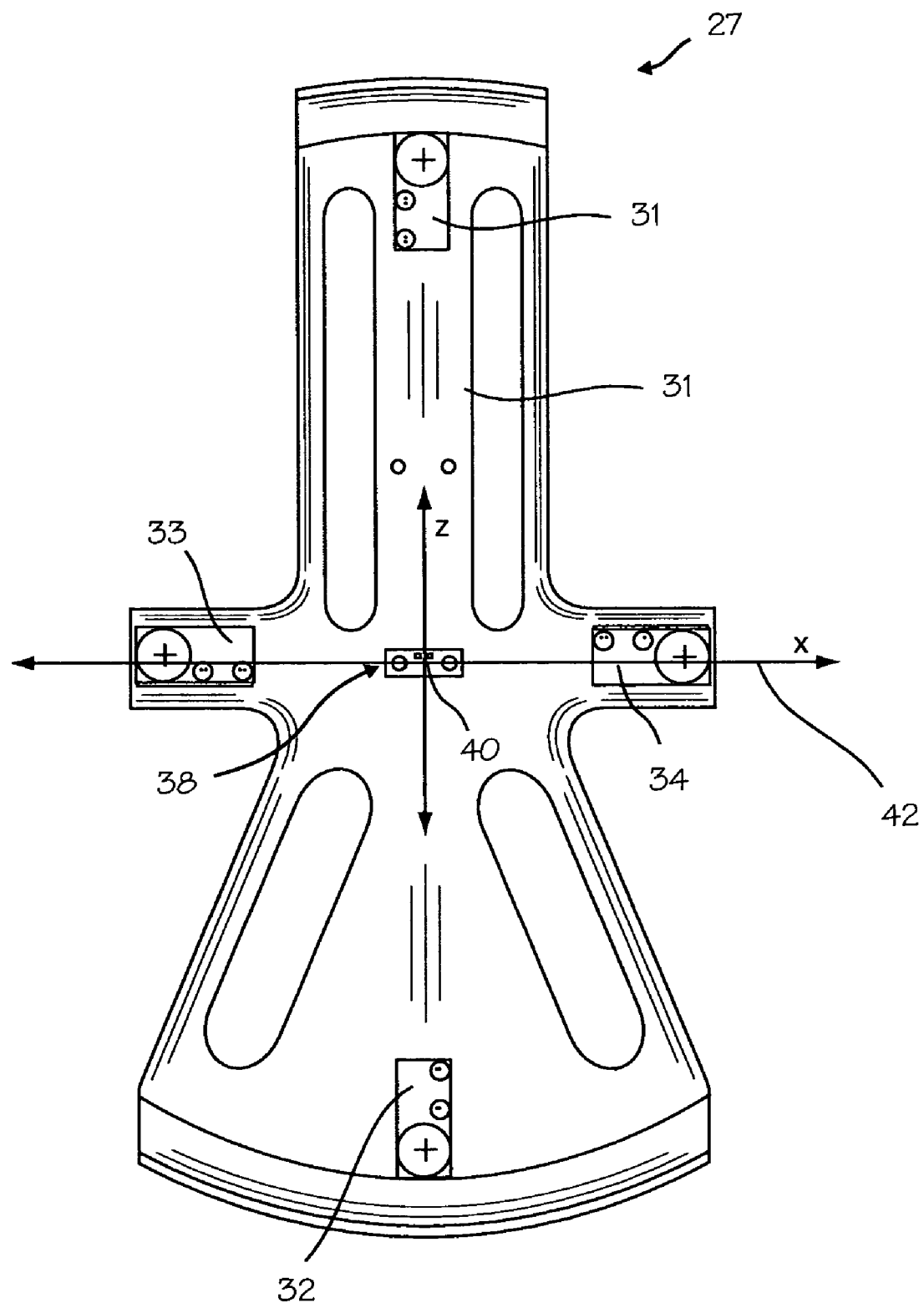
FIG. 3 illustrates the calibration array.

FIG. 3 is the calibration array. Three-dimensional space may be defined using coordinates in the x-axis, y-axis and z-axis. The calibration array is characterized by an origin 40 and a coordinate system 41 with an x-axis, y-axis and z-axis. The x-axis, y-axis and z-axis may further by characterized by quadrants. The calibration array comprises proximity sensors 31, 32, 33 and 34 adapted to measure distance in the y direction and a center-locating sensor 38 for determining the center location of a station disposed approximately at the array's coordinate system origin. The plurality of proximity sensors are used to determine planarity. The proximity sensors include sensor 31 for measuring distance in the y direction at a (z+) location, sensor 32 for measuring distance in the y direction at the (z−) location, sensor 33 for measuring distance in the y direction at the (x+) location and sensor 34 for measuring distance in the y direction at the (x−) location. Inductive sensors are used as the proximity sensors 31, 32, 33 and 34. However, any sensor adapted to determine distance may be used.

Figure 4:
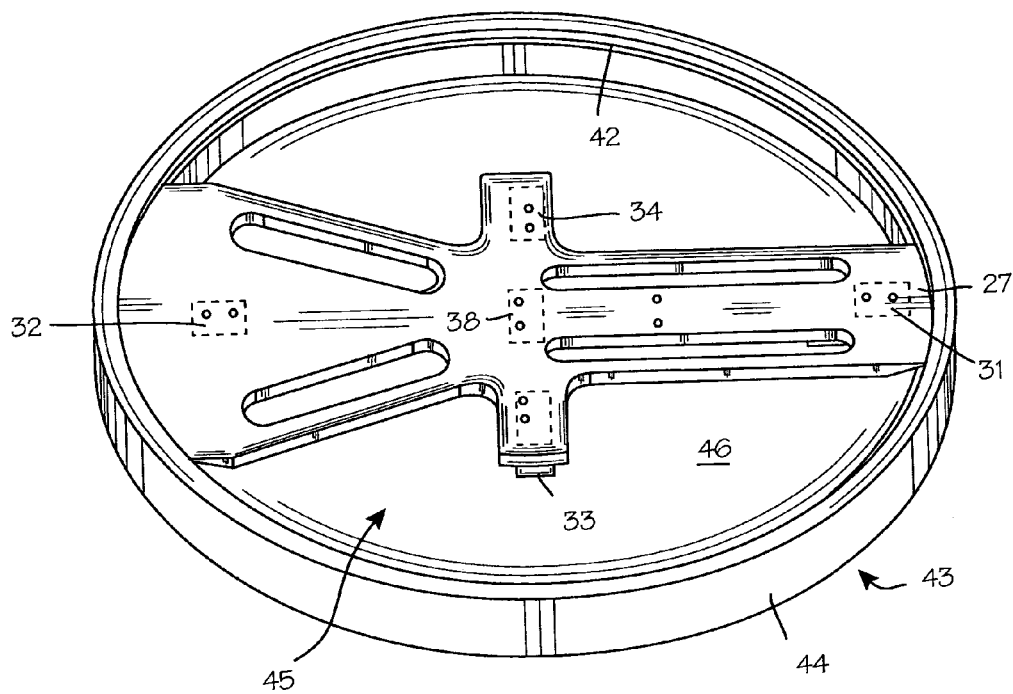
FIG. 4 illustrates the calibration array disposed on a calibration stand.
Figure 5:
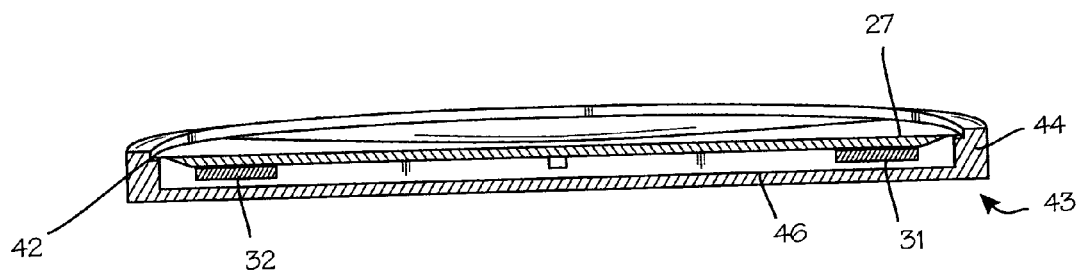
FIG. 5 is a cross-section of the calibration array disposed within the calibration stand.

FIG. 4 illustrates a calibration array disposed on a calibration stand 43 and FIG. 5 illustrates a cross-section of the calibration array disposed within the calibration stand 43. Prior to calibrating the robot 24, the calibration array 27 must be calibrated. The calibration stand is used to calibrate the calibration array 27 and the calibration array 27, in turn, is used to calibrate the robot. The inductive proximity sensors 31, 32, 33 and 34 in the calibration array have an adjustable sensing distance. Inductive sensors with adjustable sensing distance offer an advantage over inductive sensors with a fixed sensing distance in that the sensing distances can be attuned in the adjustable sensors the while the inductive sensors with a fixed sensing distance cannot. Fixed distance sensors can have a distance range that can fluctuate from one sensor to the next roughly 10% from the sensors' nominal sensing distance.

Since it is undesirable to have the planarity sensors triggering at different distances, adjustable sensors are used so the sensing distance can be precisely set. In order to perform this sensor calibration, the calibration array 27 is placed on top of a calibration stand 43. The stand comprises a disk 44 with an opening 45 sized and dimensioned to receive the calibration array. A ledge 42 lines the inner diameter of the opening and the calibration array rests on the ledge when disposed within the opening.

The calibration stand is designed with tight tolerances to ensure sensors 31, 32, 33 and 34 indicate or trigger when the sensors are within about 0.002" (0.051 mm) of a bottom surface 46 of the opening. Once the calibration array is on the calibration stand, the operator adjusts the amplifiers in the inductive sensors to a minimum sensing distance, then slowly increases the sensing distance until each sensor first indicates or triggers when it is approaching an object. After the sensor calibration is complete, the sensors 31, 32, 33 and 34 will trigger at the same distance.

Figure 6:
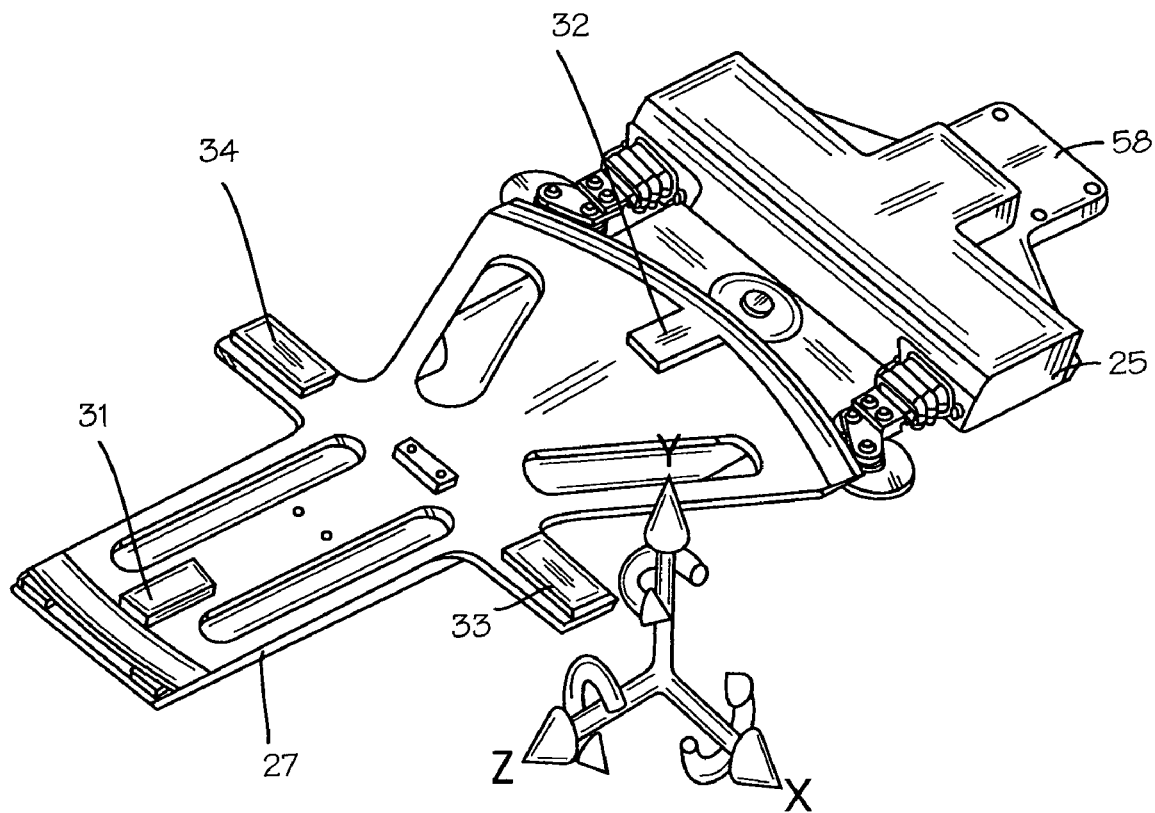
FIG. 6 illustrates a calibration array held by the end effectors.

FIG. 6 illustrates the calibration array 27 held by the end effectors 25. Proximity sensors 31, 32, 33 and 34 are shown disposed within the calibration array. Optical sensor 38 is also shown for clarity. The end effectors handles the calibration array in the same manner as it would hold a production wafer. The proximal end of the end effectors 58 is adapted for coupling to a jig 59 (not shown) disposed on the distal end of the robot.

For the calibration process, it is desirable to keep the human involvement to a minimum, as human involvement may adversely affect the calibration repeatability. Therefore, operator tasks are kept to a minimum number during the calibration procedure using the calibration system. Tasks performed by an operator include: Placing the calibration array in an end effectors; Connecting wires from the calibration array to a robot putting the calibration array in electrical communication with the control system; Placing the dummy wafer in the station which is to be calibrated; Setting calibration options in software within the control system; and activating a start button to begin the calibration procedure.

Figure 7A:
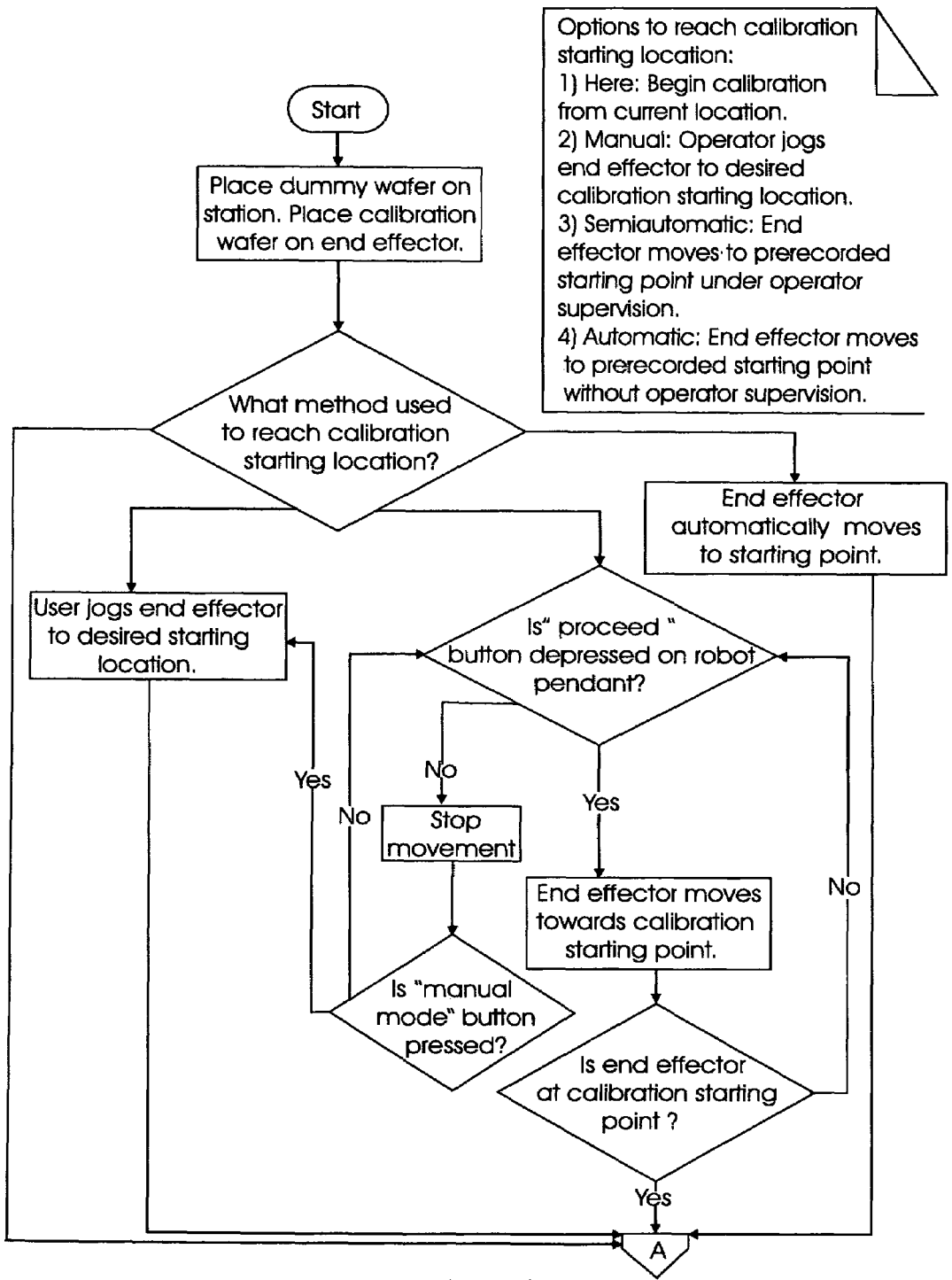
FIGS. 7A, 7B, 7C, 7D and 7E illustrate the robot calibration procedure.

The robot calibration procedure is illustrated in FIGS. 7A, 7B, 7C, 7D and 7E. FIG. 7A illustrates the process of determining the calibration starting point. First, a dummy wafer is placed in the stating and the calibration array is placed in the end effectors. Four modes are disclosed by which the end effectors can get to the starting point for a station calibration procedure. A first mode is when the end effectors is already at a location suitable for beginning the calibration procedure. In this case, the calibration procedure begins from the end effector's current location. A second mode is a manual mode, wherein the operator must manually move the end effectors to the desired starting location. A third mode is a semiautomatic mode, in which the robot will move the end effectors to a pre-recorded calibration point as long as the operator holds down the correct button on the robot's teach pendant. This is done if a calibration starting point is already saved, but the operator does not know if moving the robot to that point will cause the robot to crash into other objects. A fourth mode for starting the calibration procedure is a fully automatic mode, where the robot moves the end effectors to the pre-recorded point without the operator's supervision. This is done when the operator is certain the pre-recorded point is safe for the end effectors. When the starting point is determined, it is saved to the control computer.

Figure 7B:
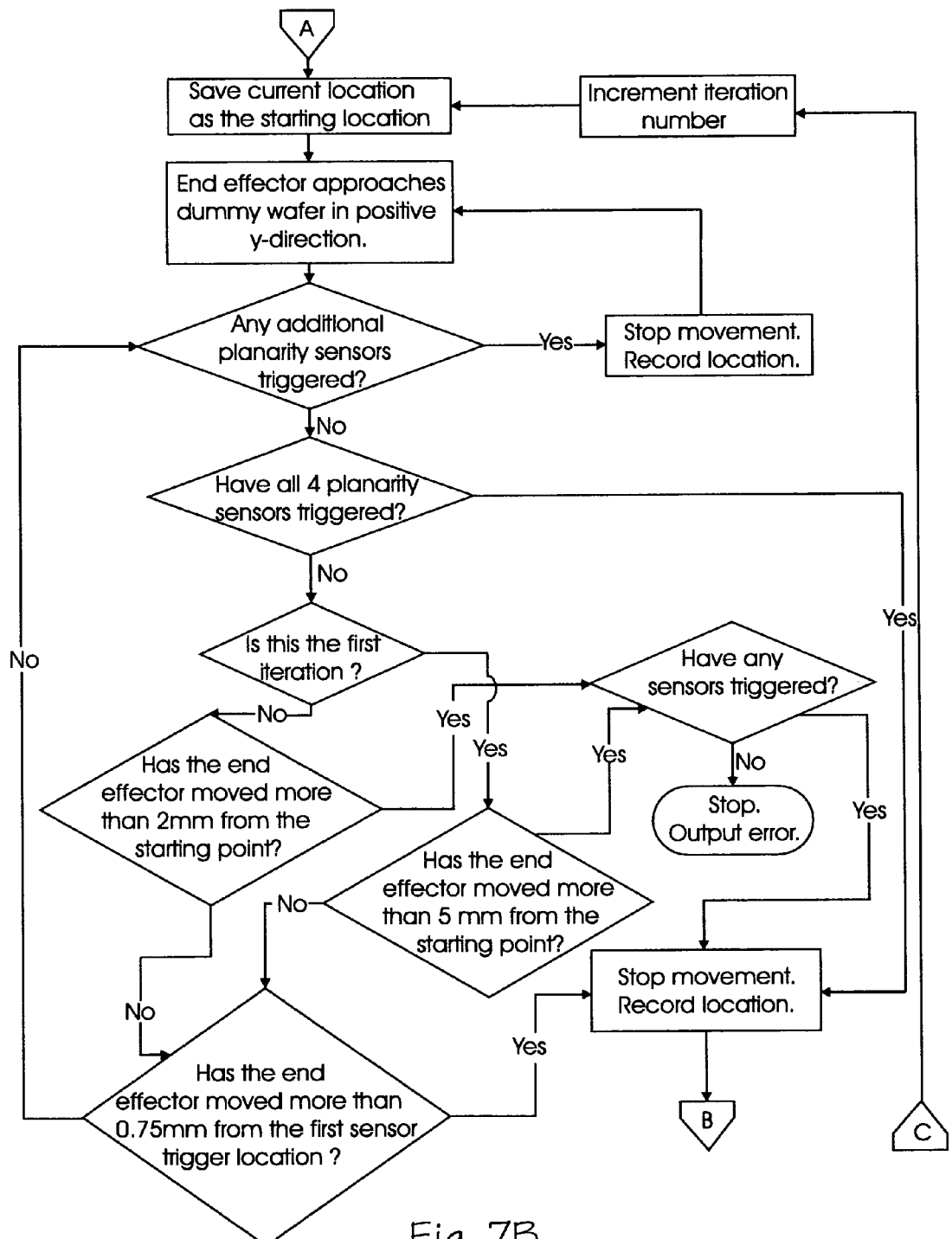
Figure 7C:
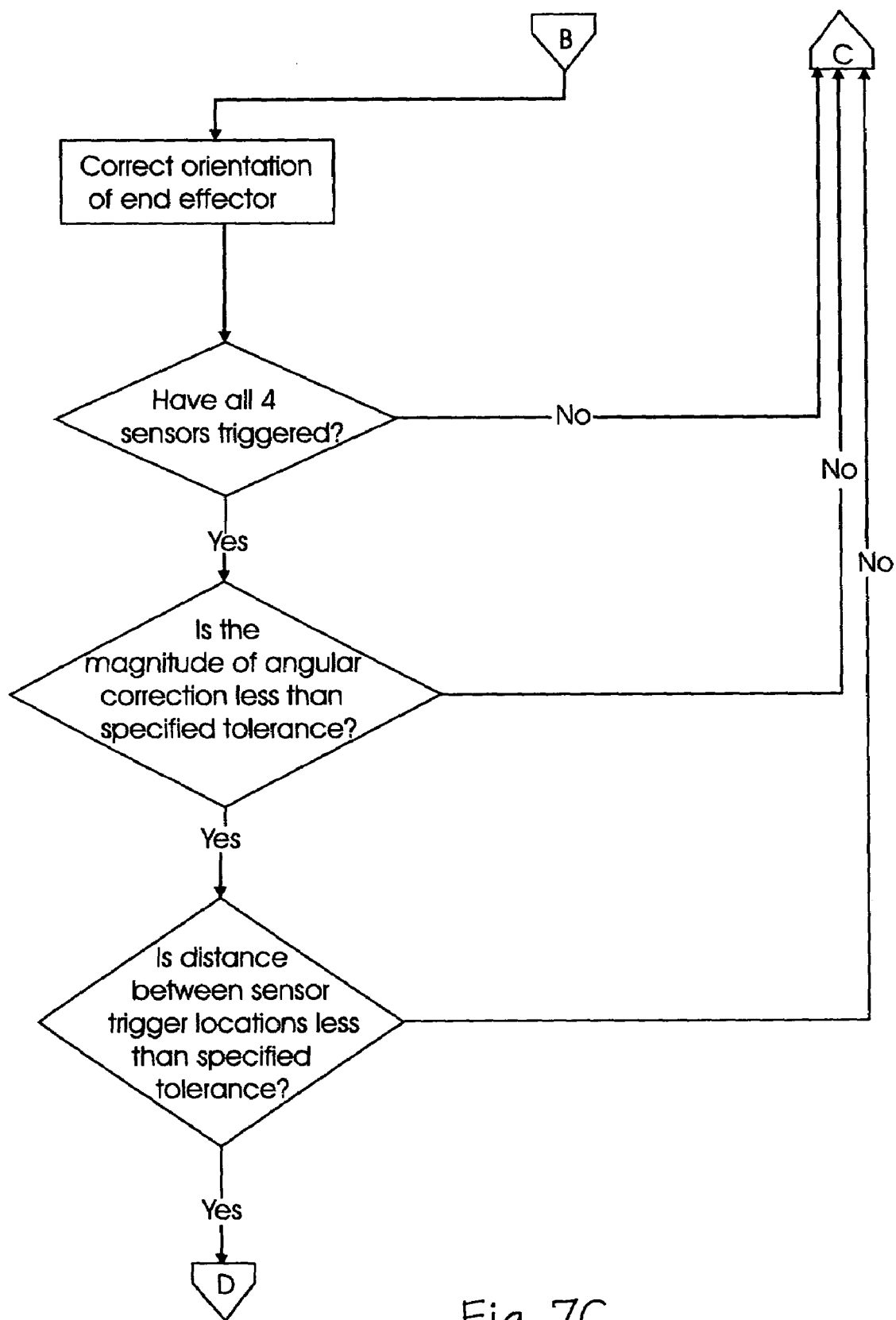

Once the starting point has been determined, the next step is to align the planes of the end effectors and the dummy wafer. FIGS. 7B and 7C illustrate a flowchart of this process. The planarity calibration begins with the end effectors proceeding to move towards the dummy wafer in the y direction, at a constant, slow speed. By recording the different locations in which the proximity sensors 31, 32, 33 and 34 trigger the relative angles of the station can be calculated. This process is performed at progressively slower speeds until the accuracy is within a desired tolerance. This process will also calibrate the distance between the dummy wafer and the calibration array in the y direction since the sensors are calibrated to trigger at a known distance.

Figure 7D:
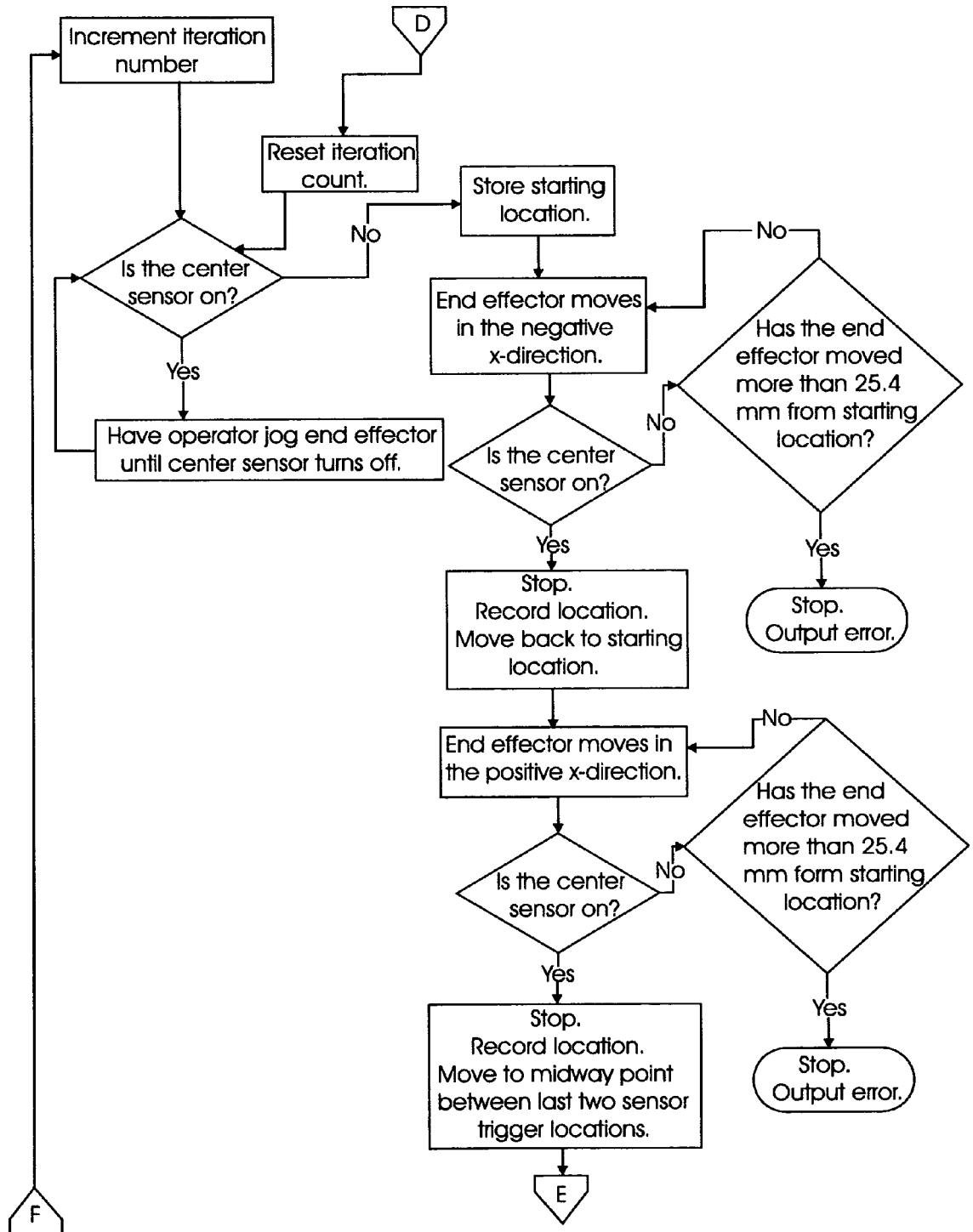
Figure 7E:
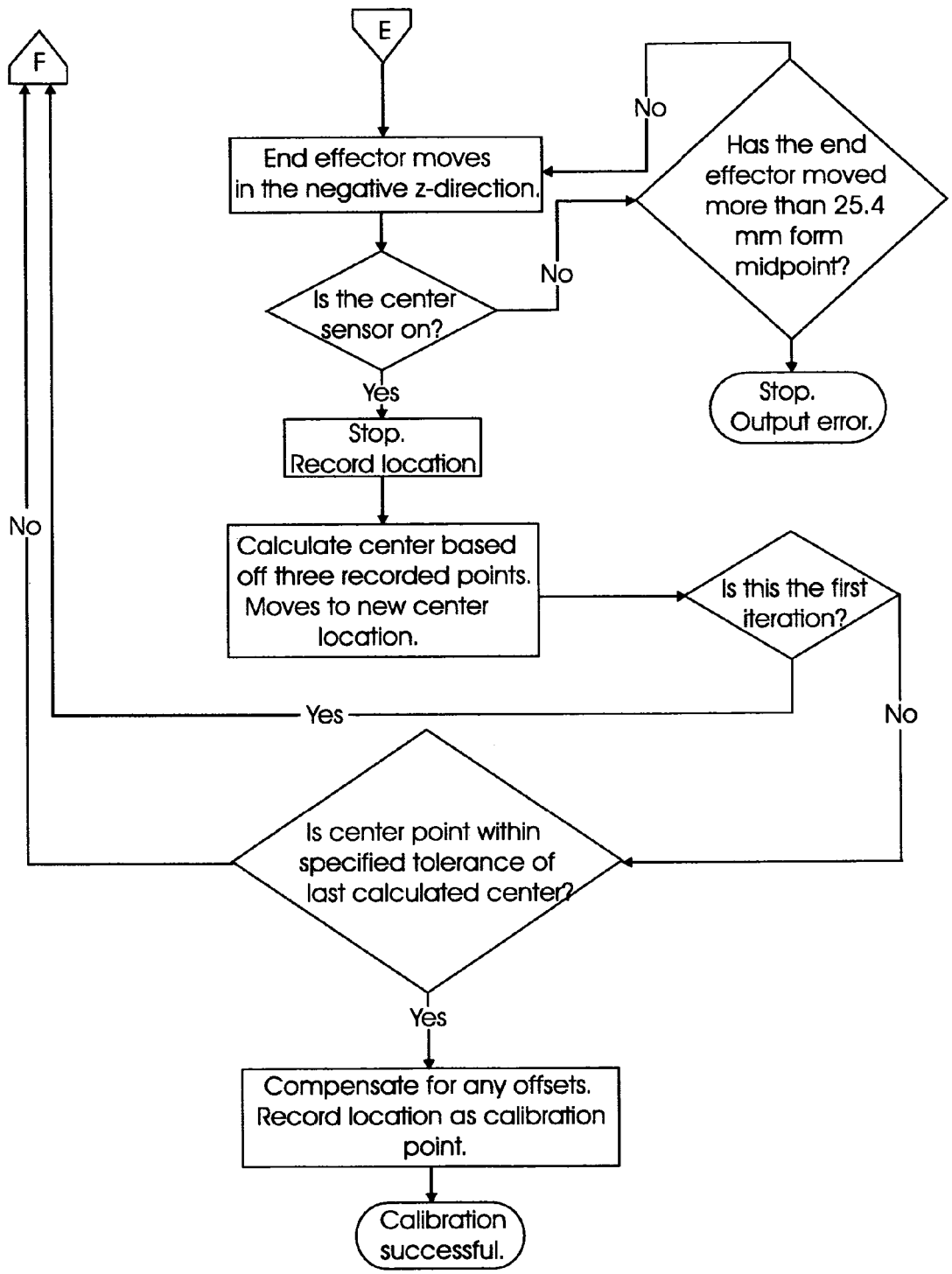

The center-locating sensor 38 located in approximately the middle of the calibration array is used find the approximate center location of the station. FIGS. 7D and 7E illustrate a flowchart of this process. The center locating process is accomplished by moving the calibration array over the dummy wafer in the x-z plane. The sensor will trigger when a transition occurs such as when the sensor moves from the inner circle's void to the solid region. The calibration array moves to different locations so that three of these transitions occur, and from these three points the center point may be calculated. The calibration routine is programmed so that the robot moves the end effectors in the negative x direction to obtain the first point, the positive x direction to obtain the second point, and the negative z direction to obtain the third point.

Figure 8:
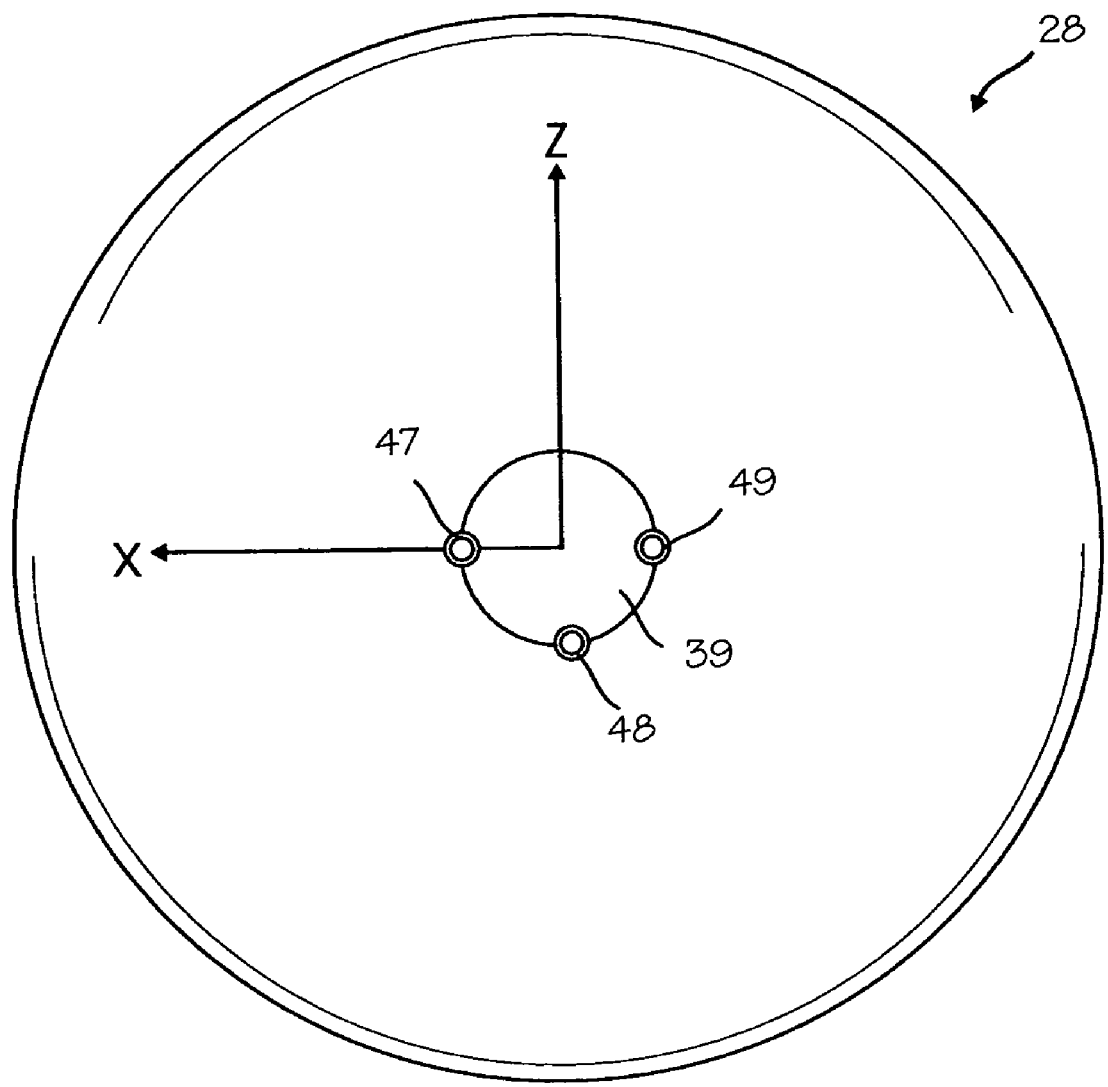
FIG. 8 illustrates the three points used to find the center of the dummy wafer.

FIG. 8 illustrates three points 47, 48 and 49 within the aperture 39 used to find the center of the dummy wafer 28. During the calibration routine, the center of the station is determined. Three points are used to determine the center of the circular aperture 39 of the dummy wafer 28. During the calibration routine, calibration array 27 moves in the negative x direction until the center-locating sensor 38 encounters a surface transition at the first point 47. The calibration array 27 then moves in the positive-x direction for until the center locating sensor 38 encounters a second surface transition at the second point 48. Next, the calibration moves in the negative-z direction until the center locating sensor 38 encounters a third surface transition at third point 49. The control system is able to calculate the center point of the dummy wafer and the station using three points 47, 48 and 49. This process may be repeated and compared to previous results. When a predetermined number of center locations, such as two center locations, are within a specified tolerance, the center calibration is completed.

After the center location in the station is found, the calibration routine applies offsets to the location to obtain the final calibrated location. The offsets compensate for any consistent errors. A height offset is used to accommodate for the thickness of the calibration array and the sensor thickness. Once the final calibrated location is found, the calibration routine saves it into the control system 29. This saved location is used as the point the robot moves the end effectors when it picks and places wafers from the particular station at which the calibration procedure was performed.

Figure 9:
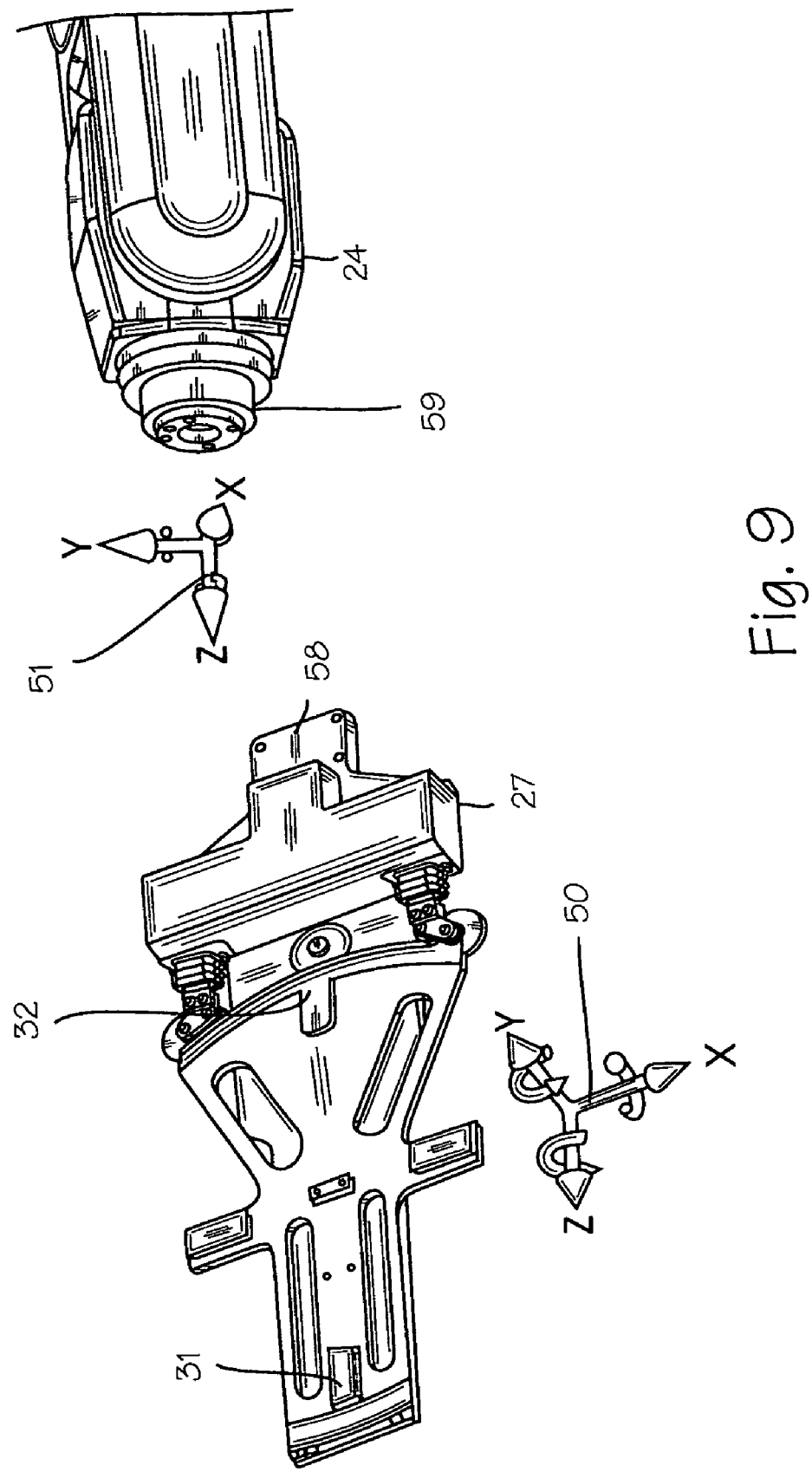
FIG. 9 illustrates an end effectors tool and the end of a robot.

FIG. 9 illustrates aligning the end effectors coordinate system 50 with the robot coordinate system 51. When the robot is in use, the proximal end of the end effectors 58 is coupled to jig 59. Correctly calibrating the orientation of the robot's tool coordinate system to match that of the physical tool coordinate system can be important to wafer pick-and-place operations. The robot calibration system is capable of end effectors tool calibration in CMP systems. The equations derived for the robot calibration process are based on the end effectors coordinate system since the calibration array is disposed on the end effectors. However, the robot makes its calibration corrective movements based on the robot's coordinate system, so it is important to align the robot's coordinate system with the end effector's coordinate system.

The robot's coordinate system is aligned with the end effector's coordinate system by a transformation in the robot's control system comprising three translational values (x, y, z) and three rotational values ($\theta_x$, $\theta_y$, $\theta_z$). The values of x, y and z translate the robot's tool coordinate system into the center point of where a wafer sits in the end effectors. FIG. 9 shows the end effectors coordinate system displayed in offset from the end effectors. Typical pick-and-place operations use translational movements and such movements are usually unaffected by the origin of the robot's tool coordinate system.

Planarity calibration, however, is affected by the origin of the coordinate system since the origin dictates the axes of rotation when the $\theta_x$ and $\theta_z$ corrections are performed. For example, when the z location of the robot's tool coordinate system is aligned to the center of where a wafer sits on the end effectors, which also is the center point between the z+ sensor 31 and the z− sensor 32, a correction in $\theta_x$ will cause both the z+ sensor 31 and z− sensor 32 to move the same distance. Otherwise, the z+ sensor 31 and z− sensor 32 will not move the same distance when the $\theta_x$ correction is performed, in which case the planarity calibration procedure can take additional time since the robot may have to perform an additional movement to get into position for the next correction. All the derived equations for the planarity correction still apply in this case since the actual axis is still parallel to the desired x-axis because it is merely offset. The sensors rotate through the same angle. Since the location of the origin of the robot's tool coordinate system only affects the amount of time necessary to carry out the calibration procedure, the x, y, and z translations have been found by physically measuring the distance between the robot's mounting flange, where the end effectors mounts to the robot, and the center point where the wafer sits on a single end effectors. Other end effectors should be sufficiently similar in construction for this transformation to be adequate.

FIG. 10 shows the consequence of the end effectors tool coordinate 50 system and robot coordinate system 51 having their $\theta_x$ orientations misaligned. As shown in FIG. 10, the robot operator attempts to perform a desired movement 52 in the positive (Z) direction, but the robot actual movement 53 is in the positive (Z) and the (y) direction because of the misalignment between coordinate systems. Similarly, such a misalignment will cause a desired move in the positive (y) end effectors direction to move the robot in the positive (Z) direction as well. When wafer pick-and-place operations are performed, the robot is required to make long translations in the tool (Z) direction in order to get in and out of the station. Several of the stations have very limited clearance in the (y) direction, so a misalignment in the tool's $\theta_x$ orientation can cause the robot to crash into the station.

Since the tool transformation orientations can be important to recalibrate after a robot hits or crashes into an object, the tool calibration routine calibrates two orientations: $\theta_x$ and $\theta_z$. Both of these orientations can be adversely affected by a robot crash. The tool calibration accuracy is determined by parameters associated with tasks being performed by the robot. An example of a task is when the end effectors picks and places wafers, which occurs when a robot moves into a station. Moving into a typical station requires the robot to move in the z direction of approximately 350 mm. Setting the tolerance for a maximum drift in the (y) direction to be approximately 1 mm for a 350 mm move in the (Z) direction, the accuracy needed for the tool calibration is:

$$\theta_x = \sin^{-1}\left(\frac{1 \text{ mm}}{350 \text{ mm}}\right)$$

Before calibration of the end effectors coordinate system relative to the robot coordinate system is performed, the robot calibration should be performed in order to get the plane of the end effectors parallel to the dummy wafer and to get the end effectors centered with the dummy wafer.

FIG. 11 illustrates $\theta_x$ tool rotation calibration procedure. The first step for calibrating the $\theta_x$ orientation involves moving the end effectors 25 with the calibration array 27 towards the dummy wafer in the (y) direction and recording the location at which the z+ sensor 31 triggers a first time 54. Next, the robot moves the end effectors in the z– direction a distance of Δz indicated by reference number 55. The robot then moves in the y-direction downward towards the dummy wafer until the Z+ sensor 33 trips a second time 56. If the physical tool coordinate system is aligned with the robot's tool coordinate system, then these two points should have the same y-coordinates and the sensor should trigger at approximately the same point. Otherwise, the difference in (y) coordinates from the first trigger point and the second trigger point is recorded as Δy indicated by reference number 57. The $\theta_z$ tool correction can be found in a similar fashion, but the movements of the end effectors parallel to the dummy wafer are in the (x) direction rather than the (Z) direction. The tool correction equations in the robot calibration system are as follows:

| Orientation | Correction |
|---|---|
| $\theta_x$ | $\sin^{-1}\left(\frac{\Delta y}{\Delta x}\right)$ |
| $\theta_z$ | $\sin^{-1}\left(\frac{\Delta y}{\Delta z}\right)$ |

While the preferred embodiments of the devices and methods have been described in reference to the environment in which they were developed, they are merely illustrative of the principles of the inventions. Other embodiments and configurations may be devised without departing from the spirit of the inventions and the scope of the appended claims.

I claim:

1. A calibration system for use with a wafer processing system having a station and a robot with an end effector sized and dimensioned to handle a semiconductor wafer comprising:
   a calibration array sized and dimension for holding by the end effector, said calibration array comprising a plurality of proximity sensors and an optical sensor;
   a dummy wafer sized and dimensioned for placement in the station, said dummy wafer having an aperture disposed in approximately its center; and
   a control system in electrical communication with the calibration array and the robot wherein the control system is programmed to determine the distance of the station relative to the robot using the proximity sensors and programmed to determine the approximate center of the station with the optical sensor when the calibration array is placed in proximity to the dummy wafer.

2. The calibration system of claim 1 wherein the dummy wafer is a disk.

3. The calibration system of claim 1 wherein the calibration array is characterized by a coordinate system with an origin, an x-axis and z-axis and the optical sensor is disposed at the approximate origin.

4. The calibration system of claim 3 wherein the plurality of proximity sensors comprises a first sensor disposed within x+ quadrants, a second sensor is disposed within x– quadrants, a third sensor is disposed within z+ quadrants and a fourth sensor is disposed within z– quadrants.

5. The calibration system of claim 1 wherein plurality of proximity sensors comprise inductive sensors.

6. The calibration system of claim 1 further comprising a calibration stand with an opening sized and dimensioned to receive the calibration array.

7. The calibration system of claim 1 wherein the calibration array further comprises a substantially planar sensor mount.

8. The calibration system of claim 1 wherein the control computer is further programmed to align an end effector coordinate system with a transformation in a robot control system using at least three translational values and at least three rotational values.

9. A method for calibrating a robot for use with a wafer processing system having a station, said a robot having an end effector sized and dimensioned to handle semiconductor wafers, said method comprising:
   providing a calibration array sized and dimension for holding by the end effector, said calibration array comprising a plurality of proximity sensors and an optical sensor;
   providing a dummy wafer sized and dimensioned to for placement in the station, said dummy wafer having a void disposed in approximately its center;
   disposing the calibration array in the end effector;
   disposing the dummy wafer in the station;
   determining the planarity of the dummy wafer relative to the calibration array.

10. The method of claim 9 further comprising the step of calibrating the proximity sensors with a calibration stand.

11. The method of claim 9 further comprising the step of moving the calibration array within about 0.002" of the dummy wafer.

12. A method for calibrating a robot for use with a wafer processing system having a station, said a robot having an end effector sized and dimensioned to handle semiconductor wafers, said method comprising:
   providing a calibration array sized and dimension for holding by the end effector, said calibration array comprising a z+ proximity sensor, z– proximity senor, x+ proximity sensor, an x– proximity sensor and an optical sensor;
   providing a dummy wafer sized and dimensioned to for placement in the station, said dummy wafer having a void disposed in approximately its center;
   disposing the calibration array in the end effector;
   disposing the dummy wafer in the station;
   moving the end effector with the calibration array towards the dummy wafer in the y-direction;
   recording the location at which the z+ sensor trips;
   moving the end effector in the z– direction a distance of Δz;
   moving the end effector in the y-direction until the z+ sensor trips a second time;
   recording the location at which the z+ sensor trips the second time.

13. The method of claim 12 further comprising the steps of:
   moving the end effector with the calibration array towards the dummy wafer in the y-direction;
   recording the location at which the x+ sensor trips;
   moving the end effector in the x– direction a distance of Δx;
   moving the end effector in the y-direction until the x+ sensor trips a second time;
   recording the location at which the x+ sensor trips the second time.

* * * * *